United States Patent [19]

Nanis

[11] Patent Number: 5,110,531
[45] Date of Patent: May 5, 1992

[54] PROCESS AND APPARATUS FOR CASTING MULTIPLE SILICON WAFER ARTICLES

[75] Inventor: Leonard Nanis, Palo Alto, Calif.

[73] Assignee: SRI International, Menlo Park, Calif.

[21] Appl. No.: 453,718

[22] Filed: Dec. 27, 1982

[51] Int. Cl.$^5$ .............................................. B29C 45/00
[52] U.S. Cl. ...................... 264/219; 264/297.2; 264/297.4; 264/313; 264/328.2; 264/328.8
[58] Field of Search ............ 264/332, 219, 313, 297.2, 264/297.4, 328.2, 328.8

[56] References Cited

U.S. PATENT DOCUMENTS

| | | |
|---|---|---|
| 3,148,131 | 9/1964 | Coursier et al. |
| 3,751,539 | 10/1971 | Reuschel et al. |
| 3,911,994 | 12/1975 | Truman |
| 3,961,803 | 6/1976 | Parsels |
| 4,120,930 | 10/1978 | Lemelson |
| 4,131,659 | 12/1978 | Authier et al. |
| 4,356,141 | 10/1982 | Sanjurjo ............................. 264/332 |
| 4,356,152 | 10/1982 | Berkman et al. |
| 5,632,708 | 3/1969 | Mandorf, Jr. et al. |

OTHER PUBLICATIONS

Quarterly Progress Rep. No. 10, "Novel Duplex Vapor-Electrochemical Method for Silicon Solar Cell", by Kapur, Nanis, Sancier & Sanjurjo, Jul. 1978.
Quarterly Process Rep. No. 11, "Novel Duplex Vapor-Electrochemical Method for Silicon Solar Cell", by Kepur, Sancier, Sanjurjo, Leach, Westphal, Bartlett and Nanis, Oct. 1978.
Quarterly Progress Rep. No. 12, "Novel Duplex Vapor-Electrochemical Method for Silicon Solar Cell", by Nanis Sanjurjo and Westphal, Jan. 1979.
Quarterly Progress Rep. No. 1, "Novel Duplex Vapor-Electrochemical Method for Silicon Solar cell", by V. J. Kapur and L. Nanis, Aug. 1976.
Quarterly Progress Report No. 2 and 3, "Novel Duplex Vapor Electrochemical Method for Silicon Solar Cell", by V. J. Kapur and L. Nanis, Mar. 1976.
Quarterly Progress Report No. 4, "Vapor-Electrochemical method for Silicon Color Cell", by: V. J. Kapur L. Nanis, and A. Sanjurjo, Jan. 1977.
Quarterly Progress Rep. No. 6, "Novel Duplex Vapor-Electrochemical Method for Silicon Solar Cell", by V. J. Kapur, L. Nanis & A. Sanjurjo, Mar. 1977.
Quarterly Progress Rep. No. 7, "Novel Duplex Vapor—Electrochemical Method for Silicon Solar Cell", by V. J. Kapur, L. Nanis & A. Sanjurjo, Apr. 1977.
Quarterly Progress Rep. No. 8, "Novel Duplex Vapor-Electrochemical Method for Silicon Solar Cell", by V. J. Kapur, L. Nanis & A. Sanjurjo, Feb. 1978.
Quarterly Progress Rep. No. 9, "Novel Duplex Vapor-Electrochemical Method for Silicon Solar Cell", V. J. Kaspur, L. Nanis, A. Sanjurjo & R. Bartlett, Apr. 1978.
Quarterly Progress Rep. No. 5, "Novel Duplex Vapor-Electrochemical Method for Silicon Solar Cell", by V. J. Kapur, L. Nanis and A. Sanjurjo, Feb. 1977.
Quarterly Progress Rep. No. 13, "Novel Duplex Vapor-Electrochemical Method for Silicon Solar Cell", by Namis Sanjurjo, Sancier, Bartlett and Westphal, Apr. 1979.
Quarterly Progress Rep. No. 14, "Novel Duplex Vapor-Electrochemical Method for Silicon Solar Cell", by L. Nanis, A. Sanjurjo and K. Sancier, Jul. 1979.
Quarterly Progress Rep. No. 15, "Novel Duplex Vapor-Electrochemical Method for Silicon Solar Cell", L. Nanis, A. Sanjurjo and K. Sancier, Nov. 1979.
Final Report, "Novel Duplex Vapor-Electrochemical Method for Silicon Solar Cell", L. Nanis, A. Sanjurjo, K. Sancier and R. Bartlett.

(List continued on next page.)

Primary Examiner—James Derrington

[57] ABSTRACT

Method and apparatus of casting silicon produced by the reaction between $SiF_4$ and an alkaline earth metal into thin wafer-shaped articles suitable for solar cell fabrication.

2 Claims, 4 Drawing Sheets

OTHER PUBLICATIONS

Leading Edge, "A Solar Silicon Solution?", SRI, Summer 1979.

"Heat Exchanger Method–Ingot Casting Fixed Abrasive Method–Multi-Wire Slicing Phase II", Schmid et al.; DOE/JPL 954373-79/9, Jun. 1979.

"Solar Silicon–A New Product for a New Age: Square Single Crystal Silicon Wafers for Solar Cells", Crystal Systems.

"Silicon Ingot Casting–Heat Exchanger Method (HEM) Multi-Wire Slicing—Fixed Abrasive Slicing Technique (FAST) Phase IV", Schmid et al.; Crystal Systems, Inc.; DOE/JPL 954373-80/17.

Q. Progress Report No. 3, Oct. 1980.

NASA Tech Briefs, "Gravity Feed Growth of Silicon Ribbon", Spring 1981.

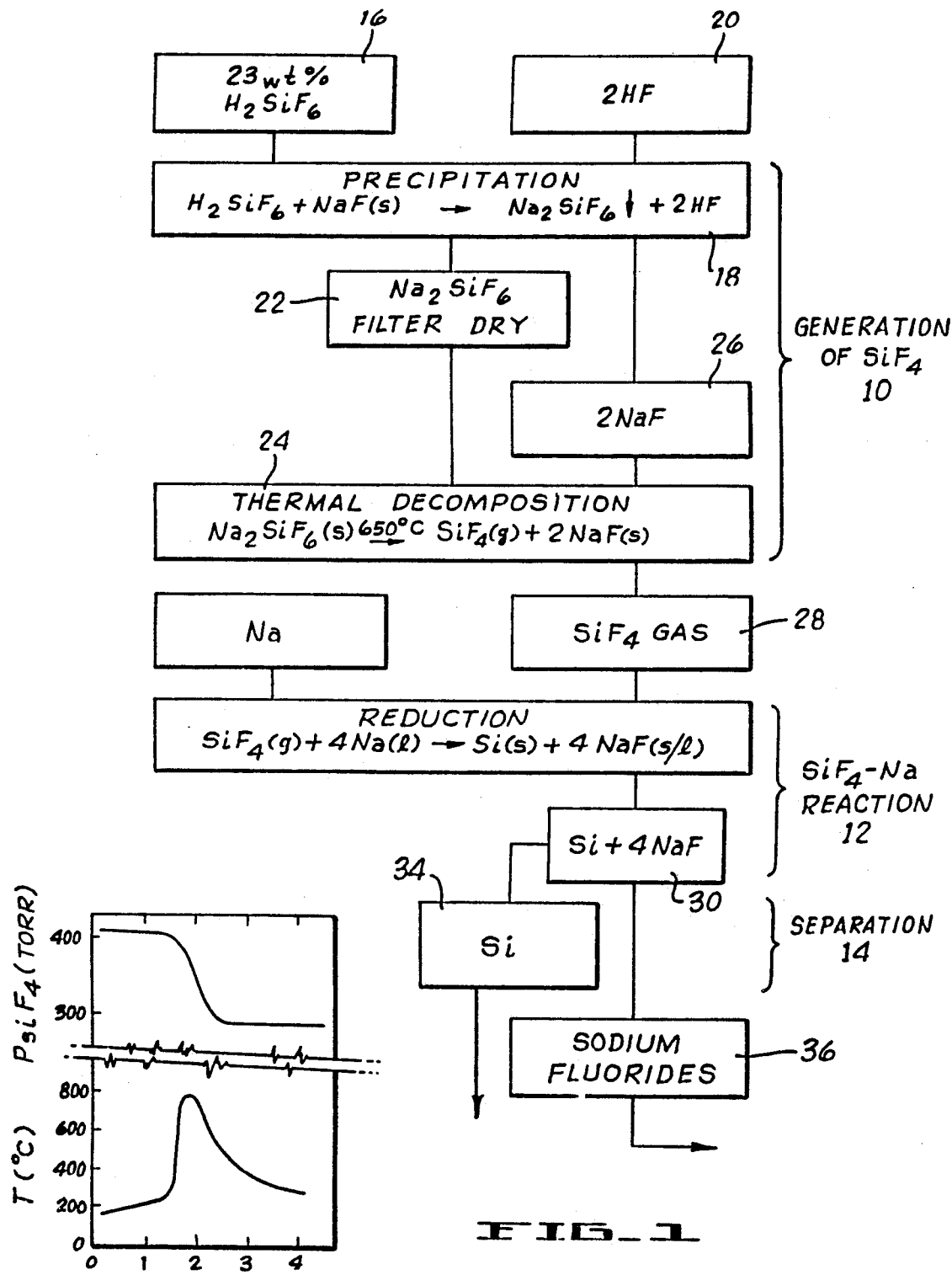
FIG_1
FIG_2

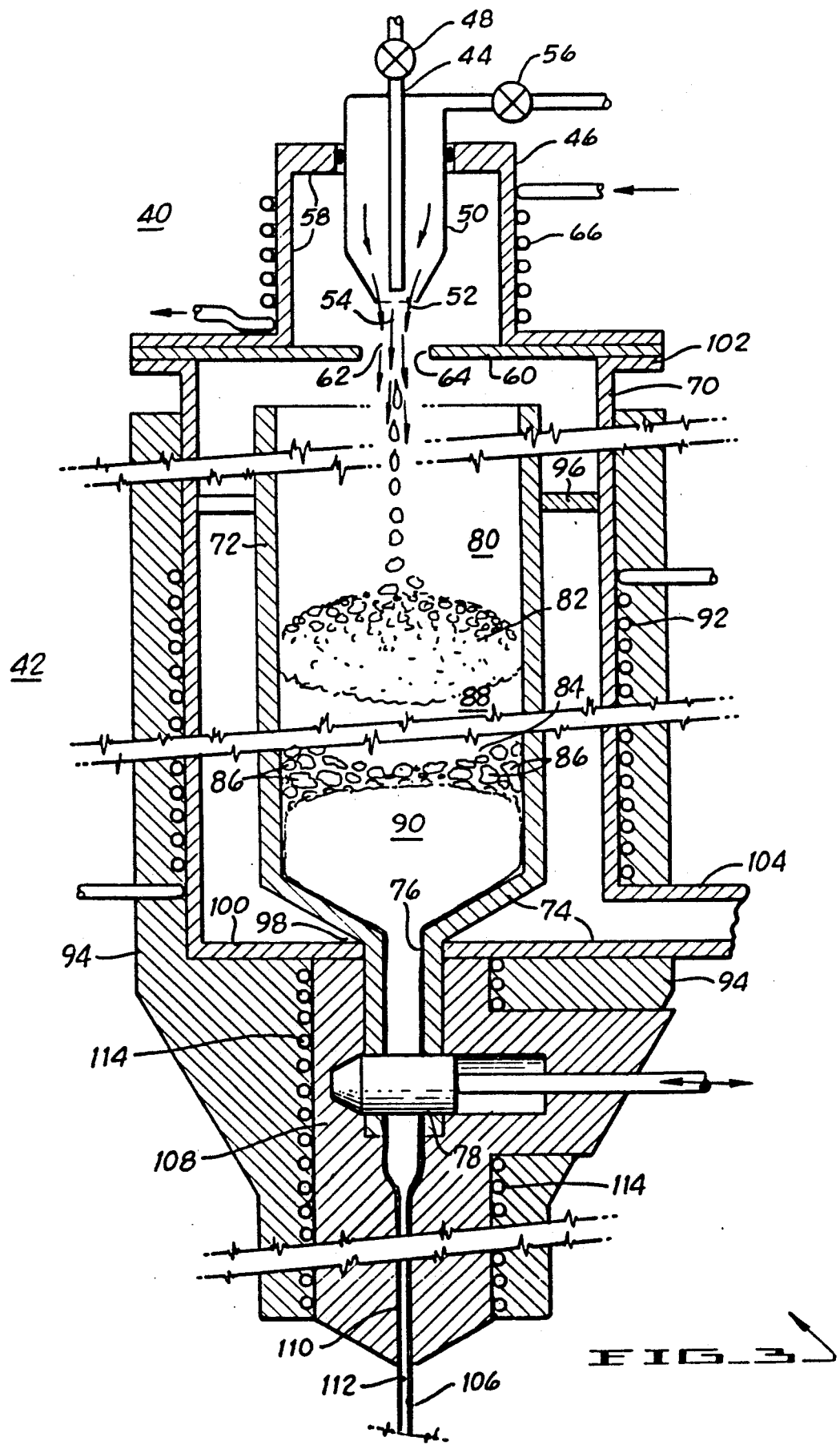
FIG_3

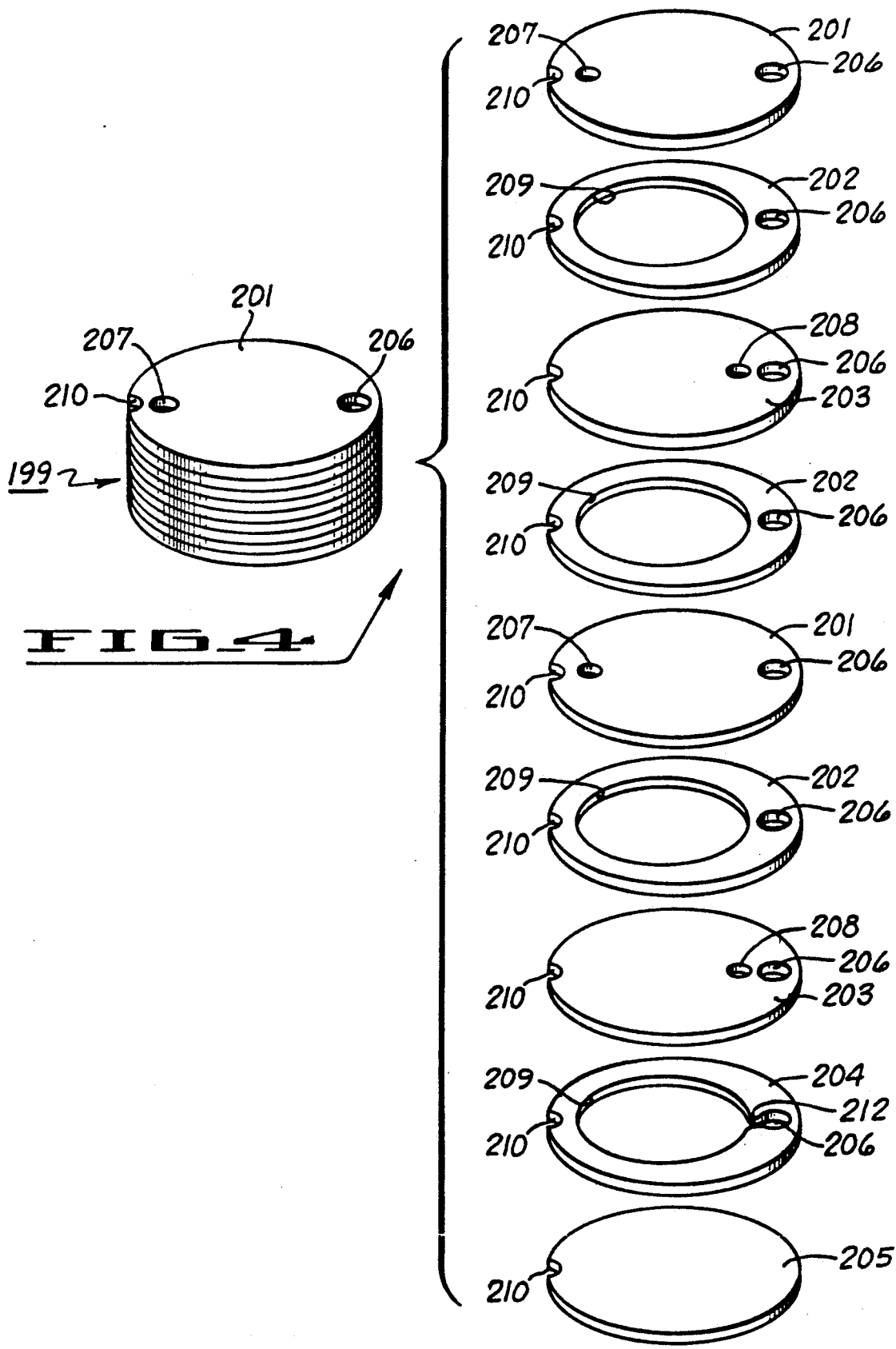

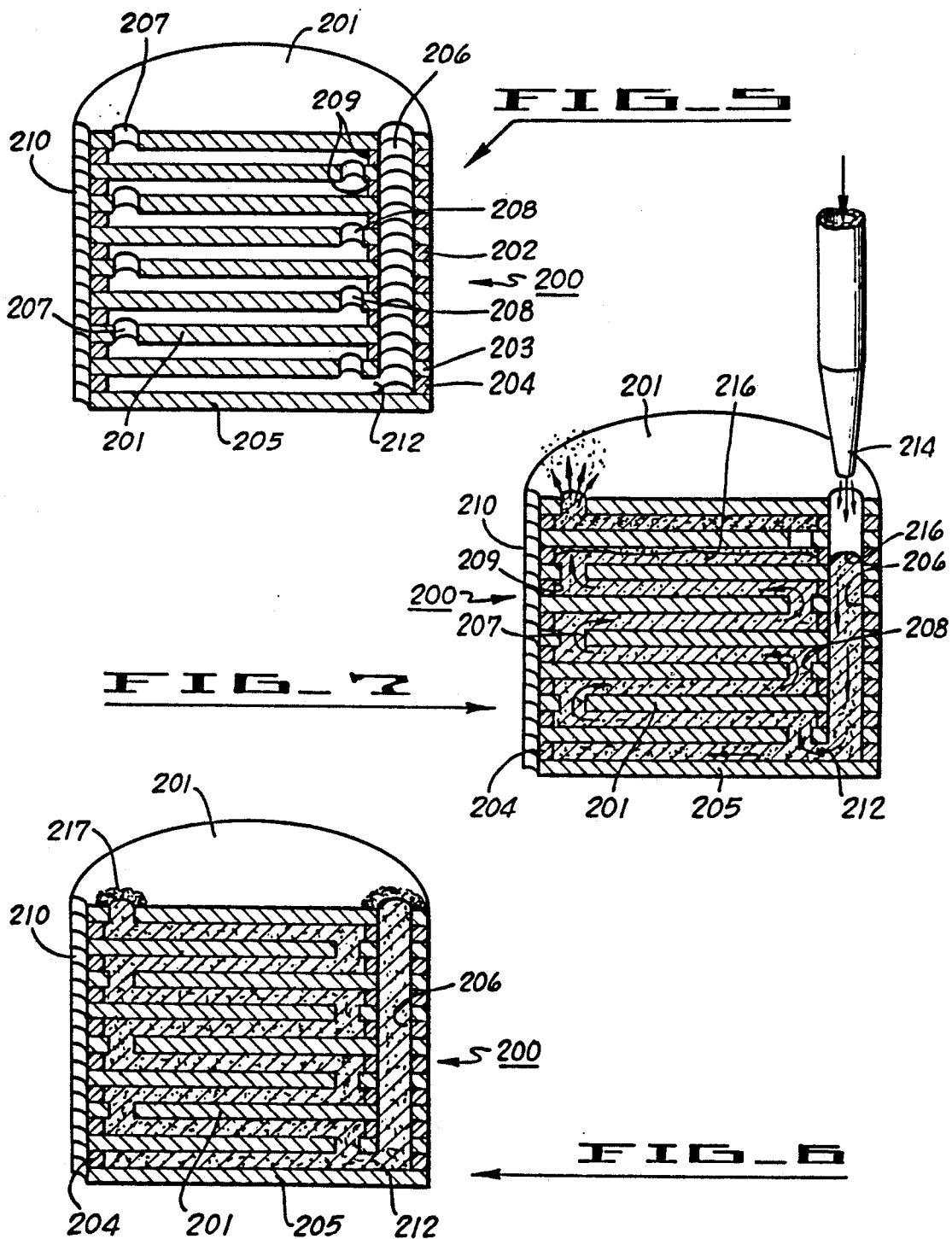

PROCESS AND APPARATUS FOR CASTING MULTIPLE SILICON WAFER ARTICLES

ORIGIN OF INVENTION

The U.S. Government has rights in this invention pursuant to JPL/DOE Contract No. 954471-NAS 7-100 awarded by the U.S. Department of Energy.

This invention together with the inventions described in the above related applications evolved (in-part) from research efforts aimed at preparing low cost, high purity silicon for solar cells. The results of that research are contained in the following reports prepared for JPL/DOE:

Quarterly Progress Report No. 1, "Novel Duplex Vapor-Electrochemical Method for Silicon Solar Cell", by: V. J. Kapur and L. Nanis, August 1976;

Quarterly Progress Report No. 2 and 3, "Novel Duplex Vapor-Electrochemical Method for Silicon Solar Cell", by: V. J. Kapur and L. Nanis, March 1976;

Quarterly Progress Report No. 4, "Novel Duplex Vapor-Electrochemical Method for Silicon Solar Cell", by: V. J. Kapur L. Nanis, and A. Sanjurjo, January 1977;

Quarterly Progress Report No. 5, "Novel Duplex Vapor-Electrochemical Method for Silicon Solar Cell", by: V. J. Kapur, L. Nanis, and A. Sanjurjo, February 1977;

Quarterly Progress Report No. 6, "Novel Duplex Vapor-Electrochemical Method for Silicon Solar Cell", by: V. J. Kapur, L. Nanis, and A. Sanjurjo, March 1977;

Quarterly Progress Report No. 7, "Novel Duplex Vapor-Electrochemical Method for Silicon Solar Cell", by: V. J. Kapur, L. Nanis, and A. Sanjurjo, April 1977;

Quarterly Progress Report No. 8, "Novel Duplex Vapor-Electrochemical Method for Silicon Solar Cell", by: V. J. Kapur, L. Nanis, and A. Sanjurjo, February 1978;

Quarterly Progress Report No. 9, "Novel Duplex Vapor-Electrochemical Method for Silicon Solar Cell", by: V. J. Kapur, L. Nanis, A. Sanjurjo, and R. Bartlett, April 1978;

Quarterly Progress Report No. 10, "Novel Duplex Vapor-Electrochemical Method for Silicon Solar Cell", by: V. J. Kapur, L. Nanis, K. M. Sancier, and A. Sanjurjo, July 1978;

Quarterly Progress Report No. 11, "Novel Duplex Vapor-Electrochemical Method for Silicon Solar Cell", by: V. Kapur, K. M. Sancier, A. Sanjurjo, S. Leach, S. Westphal, R. Bartlett, and L. Nanis, October 1978;

Quarterly Progress Report No. 12, "Novel Duplex Vapor-Electrochemical Method for Silicon Solar Cell", by: L. Nanis, A. Sanjurjo, and S. Westphal, January 1979;

Quarterly Progress Report No. 13, "Novel Duplex Vapor-Electrochemical Method for Silicon Solar Cell", by: L. Nanis, A. Sanjurjo, K. Sancier, R. Bartlett, and S. Westphal, April 1979;

Quarterly Progress Report No. 14, "Novel Duplex Vapor-Electrochemical Method for Silicon Solar Cell", by: L. Nanis, A. Sanjurjo, and K. Sancier, July 1979;

Quarterly Progress Report No. 15, "Novel Duplex Vapor-Electrochemical Method for Silicon Solar Cell", by: L. Nanis, A. Sanjurjo, and K. Sancier, November 1979;

Draft Final Report, "Novel Duplex Vapor-Electrochemical Method for Silicon Solar Cell", "Process and Apparatus for Obtaining Silicon from Fluosilicic Acid, Ser. No. 337,136 filed Jan. 5, 1982 by Angel Sanjurjo;

Process and Apparatus for Casting Multiple Silicon Wafer Articles, (Ser. No. 453,718) filed even date herewith by Leonard Nanis;

Process and Apparatus for Obtaining Silicon from Fluosilicic Acid, (Ser. No. 453,457) filed even date herewith by Kenneth M. Sancier;

Process and Apparatus for Obtaining Silicon from Fluosilicic Acid, (Ser. No. 453,596) filed even date herewith by Kenneth M. Sancier;

Process and Apparatus for Obtaining Silicon from Fluosilicic Acid, (Ser. No. 453,337) filed even date herewith by Leonard Nanis and Angel Sanjurjo; and Process and Apparatus for Obtaining Silicon from Fluosilicic Acid, (Ser. No. 453,456) filed even date herewith by Angel Sanjurjo, now U.S. Pat. No. 4,442,082 having an issue date Apr. 10, 1984."

BACKGROUND OF THE INVENTION

1. Field of Invention

Silicon is, at present, the most important material in modern semiconductor technology and is finding increased use in solar cells for the photovoltaic generation of electricity. In view of the importance of the solar cell application, the stringent requirements for purity and low cost and further in view of the orientation of the work done, the process and apparatus is described primarily in the context of production of silicon and silicon articles suitable for solar cell fabrication. However, it is to be understood that both the process and apparatus used are generally useful in the production of silicon in any desired shape for whatever end use, as well as other transition metals such as Ti, Zr, Hf, V, Nb and Ta.

A major deterrent to the development of practical solar photovoltaic systems is the cost of high purity silicon. With todays technology, approximately twenty percent of the total cost of a silicon solar cell is ascribed to the silicon material alone. That is, the cost of the silicon material produced by the conventional hydrogen reduction of chlorosilanes constitutes at least twenty percent of the cost of producing the cell. It is estimated that the cost of the silicon must be reduced by almost an order of magnitude before silicon solar photovoltaic panels will prove to be economically feasible as a power source. The fact that the chlorosilane processes require multiple separations, are so energy intensive and require such large capital investments indicate that cost of the silicon can not be reduced sufficiently to make silicon solar cells economically feasible without a major process change. Moreover current solar cell technology is based on the use of Si wafers obtained by slicing large Czochralski crystals or float-zone ingots, using single-blade inner diameter diamond saws. Nearly 30 to 40% of the silicon is lost as sawdust in the slicing process. In order to decrease the material lost in sawing and increase the number of silicon wafers produced from a single crystal or ingot, techniques would have to be developed using multiple saws with thin sawblades, sawing wires, or other advanced processes to produce thinner wafers. The difficulties or problems in cutting thinner crystal wafers increase with crystal diameter.

Therefore, considerable material, energy, and capital equipment could be saved if a process could be developed for forming silicon wafers in a mold. As a consequence, an approach to the production of solar grade silicon and silicon articles (wafers) suitable for fabrication into solar cells which is less complex, less energy intensive and which requires less capital equipment would be most desirable.

TECHNICAL FIELD OF THE INVENTION

It has been found that silicon of more than sufficient purity to meet the solar cell applications can be produced within the economic requirements from the metallic reduction of silicon fluoride. Preferably, the silicon fluoride is prepared from an aqueous solution of fluosilicic acid, a low cost waste by-product of the phosphate fertilizer industry by treatment with a metal fluoride which precipitates the corresponding fluosilicate. This salt is filtered, washed, dried and thermally decomposed to produce the corresponding silicon tetrafluoride and metal fluoride which can be recycled to the precipitation step. The silicon tetrafluoride is then reduced by a suitable reducing metal and the products of reactions are treated to extract the silicon. Each of the steps is described in detail using sodium as typical reducing agent, and sodium fluoride as typical precipitating fluoride but the concept applies as well to other reducing metals and metal fluorides that can reduce silicon fluoride and form fluosilicates.

The process in one form is described in detail in an article entitled Silicon by Sodium Reduction of Silicon Tetrafluoride authored by A. Sanjurjo, L. Nanis, K. Sancier, R. Bartlett and V. J. Kapur in the Journal of the Electrochemical Society Vol. 128, No. 1, January 1981 and the subject matter of that article is specifically incorporated herein by reference.

BACKGROUND

There are available systems for the production of silicon utilizing some of the reactions of the present system. For example, Joseph Eringer in U.S. Pat. No. 2,172,969 describes a process wherein sodium silicofluoride is mixed with sodium in powder form and placed in a crucible which is heated and in the upper part of which two pieces of copper wire gauze are placed parallel to each other. The space between the pieces of gauze, which can also be heated, is filled with copper wool. When the crucible has been filled and closed, it is heated to about 500° C. At this temperature, reaction takes place and silicon and sodium fluoride are formed whereby the silicon which is mechanically expelled by the sudden increase in pressure is collected in chambers or towers connected to the furnace.

The equation of the reaction is as follows:

Na$_2$SiF$_6$+4Na=Si+6NaF or this can be expressed:

Na$_2$SiF$_6$=SiF$_4$+2NaF

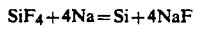

SiF$_4$+4Na=Si+4NaF

After the reaction product has been cooled at least to about 200° C. it is finely divided and is treated with water or heat treated with dilute 1:1 sulfuric acid. Hydrogen fluoride gas is liberated (which latter can then be made into hydrofluoric acid or a metallic fluoride) metallic sulphates are produced and the silicon separates out on the surface in amorphous form as shining metallic froth.

The reaction expressed in equation form is:

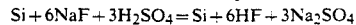

Si+6NaF+3H$_2$SO$_4$=Si+6HF+3Na$_2$SO$_4$

After the silicon has been separated from the metallic sulphate solution, it is again washed and is dried at about 80° C. The silicon obtained in this way is in the form of an impalpable redish or grey-brown powder which discolors strongly and which, even if the raw products were impure, contains a minimum of 96-97% silicon. The yield amounts to about 87% of the theoretically possible yield.

Robert Aries reports in U.S. Pat. No. 3,041,145 that attempts made to reduce silicon halides by the use of sodium vapor have not led to a commercially successful process. He gives as an example the process discussed in the Eringer patent, supra, and points out 96%-97% purity is entirely outside the range of purity required for silicon to be used for photocells, semiconductor rectifiers, diodes, and various types of electronic equipment. As has already been discussed, the conventional hydrogen reduction of chlorosilanes especially with the electro-thermal deposition techniques used, is too energy intensive to be economical.

Aries ascribes the purity problem to impurities in the sodium used in the reduction reaction and teaches that further elaborate and expensive purification of the purest available commercial grade sodium is required to produce silicon of solar or semiconductor grade. More recently, V. J. Kapur in U.S. Pat. No. 4,298,587 also supports the view that such purification is required. In fact, this patent teaches that both the sodium and the silicon tetrafluoride must be purified using an energy intensive technique comparable to the electro-thermal deposition systems of the chlorosilane reduction processes.

It has been determined that silicon of the desired grade is obtained without the elaborate purification of commercial grade sodium or silicon tetrafluoride obtained from the fluosilicic acid (from the reaction shown above) provided the reduction reaction is carried out in such a way that it goes to completion, the proper environment is maintained during the reduction reaction and the product is properly isolated from contaminating atmosphere and container walls until the reaction is complete and solid silicon which is below reaction temperature is formed and separated. In copending patent application entitled Process and Apparatus for Obtaining Silicon from Fluosilicic Acid, Ser. No. 337,136 filed Jan. 5, 1982 by Angel Sanjurjo and assigned to the present assignee, the isolation from the container is carried out using a powdered substance so that the reaction product does not adhere and can be removed by a simple dumping process. The system is successful but generally is not needed in connection with the melt separation and casting process of the present process.

Angel Sanjurjo teaches in Abstract No. 325 entitled "Technique to Cast Silicon for Solar Cells" in The Extended Abstracts of The Electrochemical Society", Vol. 128, No. 1 (Jan. 6, 1981) and (copending) U.S. Pat. No. 4,356,141 methods for casting silicon sheets. The mold shaping process is ideal for forming one of a kind shapes. In order to reproduce identical shapes, the temperature and pressure must be accurately controlled.

The present invention is directed to the part of the process which deals with the manner of casting Si produced by the reaction between SiF$_4$ and an alkaline earth metal (e.g., Na) into thin wafer shaped articles suitable for solar cell fabrication. In carrying out the reaction, finely divided reactants are jetted into the reaction chamber. Both U.S. Pat. No. 4,188,368 to Wolf et al and U.S. Pat. No. 4,102,765 to Fey et al deal with reactions where Si is produced using finely divided injected feed stocks. Keeton U.S. Pat. No. 4,169,129 discloses an apparatus and process for pulse feeding a fine spray of liquid Na into a Si production reactor. Bagley U.S. Pat. No. 2,995,440 and Baker U.S. Pat. No. 3,069,255 disclose procedures for introducing molten Na into a reaction vessel with chlorides of titanium, while Hill U.S. Pat. No. 2,890,953 discloses a procedure for adding atomized liquid Na in a reactor (also with chlorides of titanium). Maurer (U.S. Pat. No. 2,941,867) separately charges a reducing metal reactant and a halide of a high melting metallic element from group II, III, IV, V and VI of the periodic table both in the fluid state into an externally cooled reaction zone. However, none of these patents deal successfully with the important problem of feed nozzle plugging.

In order to appreciate the problem of carrying out the reaction, consider (as noted above) that when liquid Na at about 150° C. contacts $SiF_4$, a rapid exothermic reaction takes place. The Na burns in the $SiF_4$ atmosphere to produce Si and NaF. Since Na melts at about 98° C., in principle, liquid Na at temperatures below about 140° C. can safely be drop-fed into a reactor kept under a constant $SiF_4$ pressure. The reaction takes place at the bottom of the reactor which is kept at temperatures above about 200° C. Experimentally, it is observed that due to the heat generated by the reaction, the Na injection nozzle overheats and the reaction takes place at the nozzle causing a build up of reaction products which plug the nozzle, and thus, the Na feeding system. Further, the reaction products produced by the systems disclosed in the patents are in a form that is difficult to separate. In view of the stringent purity requirements for solar grade silicon, separation techniques that tend to introduce impurities are distinctly disadvantageous.

The present invention is specifically concerned with casting multiple silicon wafer shaped articles (suitable for solar cell fabrication) directly from separated (molten) reaction products (Si and NaF) produced by reaction of $Na_2SiF_6$ and $SiF_4$.

SUMMARY AND OBJECTS OF INVENTION

In carrying out the present invention sodium fluosilicate $Na_2SiF_6$ is precipitated from fluosilicic acid followed by thermal decomposition of the fluosilicate to silicon tetrafluoride $SiF_4$. The $SiF_4$ is then reduced by an alkali metal, preferably Na, to obtain silicon which is separated from the mix, by melt separation. The reduction reaction is carried out by jetting finely divided reactants into a reaction chamber at a rate and temperature which causes the reaction to take place far enough away from the injection or entry region so that there is no plugging at the entry area and thus, the reactants are freely introduced. Preferably the reaction is carried out in such a manner that the resulting reaction products (Si and NaF) are continuously separated by melt separation and the Si directly cast into wafer shapes suitable for fabricating into solar cells.

The invention has for its principal object the provision of a process for obtaining silicon of sufficient purity to produce solar photovoltaic cells inexpensively enough to make their use practical.

A further object of this invention is to provide a process by means of which silicon can be obtained which is substantially free of impurities starting with relatively inexpensive and impure fluosilicic acid.

A still further object of this invention is to provide a process for producing Si wherein $SiF_4$ and a reductant, preferably Na, are introduced into a reactor in finely divided form and at a rate and temperature that causes the reduction to take place at a location removed from the entry area so that the reaction products do not prevent introduction of either of the reactants into the reactor.

Another object of the invention is to provide a process for producing solar grade Si by reaction of $SiF_4$ and a reductant in such a manner that Si is separated from the reaction products continuously and directly.

Yet another object of the invention is to provide a reactor vessel for separating Si from the molten reaction products of a Si producing reaction.

Still a further object of the invention is to provide process and apparatus for continuously separating Si in molten form from the molten reaction products.

Another object of the invention is to avoid one or more (casting) disadvantages of the prior art.

Still another object of the invention is to avoid the disadvantages of forming wafer shape silicon articles by mold shaping using dies.

Another object of the invention is to avoid the material loss involved in forming wafer shape silicon articles by sawing.

A further object of the invention is to provide a multi-cavity mold for casting silicon into shapes suitable for fabricating into solar cells.

Another object of the invention is to provide process and apparatus for casting Si into articles suitable for fabrication into solar cells.

A further object of the invention is to provide process and apparatus for casting multiple silicon wafer articles suitable for fabrication into solar cells.

The novel features which are believed to be characteristic of the invention are set forth with particularity in the appended claims. The invention itself, however, both as to its organization and method of operation, together with further objects and advantages thereof may best be understood by reference to the following description taken in connection with the accompanying drawings.

BRIEF DESCRIPTION OF THE DRAWINGS

FIG. 1 is a flow diagram illustrating a preferred embodiment of the process for producing high purity silicon by the melt process;

FIG. 2 is a graph illustrating the time, temperature and pressure characteristics of the silicon fluoride and sodium reaction showing time in minutes plotted along the axis of abscissae and temperature in degrees C. and pressure (torr) plotted along the axis of ordinates;

FIG. 3 is a somewhat diagrammatic central vertical section through a reactor unit showing reaction product separation means, Si discharging means, NaF discharging means, and details of one embodiment of the Na and $SiF_4$ feed mechanism according to the present invention;

FIG. 4 is a perspective view showing details of a modular four cavity segment mold and a perspective view of a preferred segment stacking order in accordance with one embodiment of the present invention;

FIG. 5 is a diagrammatic central vertical section through a modular eight cavity segment mold;

FIG. 6 is an illustration of FIG. 5 showing the mold cavities filled with molten salt in accordance with the practice of the invention; and FIG. 7 is an illustration of the embodiment of FIG. 6 showing displacement of molten salt by the injection of molten silicon.

DESCRIPTION OF PREFERRED EMBODIMENTS

A preferred embodiment of the process for production of pure silicon and (wafer shaped) silicon articles starting with inexpensive commercial grade fluosilicic acid is illustrated in the flow diagram of FIG. 1. The overall process consists of four major operations which encompass a series of steps. The first major operation (shown in brackets 10 in the drawing) includes the step of precipitation of sodium fluosilicate from fluosilicic acid followed by generation of silicon tetrafluoride gas. The second major operation (brackets 12 in the drawing) comprises the reduction of silicon tetrafluoride to silicon, preferably by sodium. The third operation (brackets 14) involves the separation of silicon from the mixture of silicon and sodium fluoride, and the fourth operation (brackets 15) involves the method of casting silicon into multiple wafer shaped articles suitable for fabrication into solar cells.

Consider first the steps for generation of silicon tetrafluoride (operation 10). The preferred starting source of silicon is an aqueous solution of fluosilicic acid ($H_2SiF_6$), a waste product of the phosphate fertilizer industry, that is inexpensive and available in large quantities. Fluosilicic acid of commercial grade [23 weight percent (w %)] has also been used directly as received without purification or special treatment and is shown as the silicon source 16 in FIG. 1. As another alternative, fluosilicic acid is obtained by treating silica, or silicates (natural or artificially made) with hydrogen fluoride. The $SiF_6^{-2}$ is then precipitated in sodium fluosilicate $Na_2SiF_6$, by adding a sodium salt to the solution (step 18). Other salts such as NaF, NaOH, NaCl, or similar salts of the elements in groups IA and IIA of the periodic table are all candidates. The major selection criteria are, low solubility of the corresponding fluosilicate, high solubility of impurities in the supernatant solution, high solubility of the precipitating fluoride salt, and non-hygroscopic character of the fluosilicate.

Based on these criteria, the preferred fluosilicates in order of preference are $Na_2SiF_6$, $K_2SiF_6$ and $BaSiF_6$. Using the preferred NaF as the precipitating salt, the hydrogen of the fluosilicic acid is displaced by the sodium to form sodium fluosilicate, a highly stable, non-hygroscopic, white powder, and sodium fluoride which is recycled. In equation form the reaction is

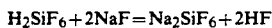

$H_2SiF_6 + 2NaF = Na_2SiF_6 + 2HF$

As an example, Sodium fluosilicate was precipitated by adding solid sodium fluoride directly to the as received commercial grade fluosilicic acid 18. The yield was a supernatant liquid containing mostly HF and some NaF and $H_2SiF_6$ along with the sodium fluosilicate. HF is also given off (20). The supernatant fluid was removed and the sodium fluosilicate washed with cold distilled water to remove any remaining HF and $H_2SiF_6$. After filtering and drying in an oven at 200 degrees C., a minimum yield of 92% of pure sodium fluosilicate 22 (determined by x-ray diffraction) was obtained. The product sodium fluosilicate is a nonhygroscopic white powder that is very stable at room temperature and thus provides an excellent means for storing the silicon source before it is decomposed to silicon tetrafluoride.

Precipitation under the just described conditions acts as a purification step, with most impurities in the original fluosilicic acid staying in solution. This effect is increased by adding suitable complexing agents to the fluosilicic acid solution previous to the precipitation. Both inorganic complexing agents such as ammonia and organic agents such as EDTA (ethylenediaminetetraacetic acid) help to keep transition metal ions in solution during precipitation of the fluosilicate.

The fluosilicate is thermally decomposed 24, thus,

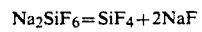

$Na_2SiF_6 = SiF_4 + 2NaF$ to give the solid sodium fluoride, which is recycled 26, and to generate the $SiF_4$ gas 28. The decomposition does not take place appreciably at temperatures below about 400° C. Therefore, impurities which are volatile at this temperature can easily be removed by a vacuum treatment below this temperature. The decomposition of $Na_2SiF_6$ takes place at temperatures between about 500° and 700° C. Impurities left in the solid phase are typically transition metal fluorides such as Fe, Ni, Cu, etc., whose volatility at temperatures below about 700° C. is very low and therefore do not contaminate the $SiF_4$ gas. The gas thus produced can be fed directly to the reduction reactor or it can be stored for future use.

In separate experiments, it was determined that $SiF_4$ gas at a pressure of 0.4 atm is in equilibrium at about 650° C. with solid $Na_2SiF_6$ and NaF. Therefore, as $SiF_4$ is needed, the $Na_2SiF_6$ is thermally decomposed (FIG. 1) at about 650° C. in a graphite-lined, gas-tight stainless steel retort. Gaseous $SiF_4$ evolved at about 650° C. was condensed as a white solid in a storage cylinder (cooled by liquid nitrogen) attached to the retort. The $SiF_4$ gas was allowed to expand by warming of the storage cylinder to room temperature and was fed into the reactor as needed. $SiF_4$ gas prepared in this manner was determined by mass spectrometric analysis to be more pure than commercial grade $SiF_4$, as shown in Table I. Ions formed from the sample gas were identified from the observed mass numbers, isotopic distribution and threshold appearance potentials. The detection limit was better than about 0.005%. Positively identified gaseous impurities are listed in Table I; no metallic impurities were detected. Peaks corresponding to B compounds, such as $BF_3$, were specially checked, but none were found.

Although the $SiF_4$ produced from $H_2SiF_6$ has less impurity, the commercial grade $SiF_4$ was also used for experimental convenience. The possible presence of metallic impurities in commercial $SiF_4$ was determined by bubbling the gas through high purity water and treating the resulting slurry with an excess of HF to drive off Si as $SiF_4$.

TABLE I

| | Mass spectrometric analysis of $SiF_4$ | |
|---|---|---|
| Ion | $SiF_4$ prepared from $H_2SiF_6$ (%) | $SiF_4$ commercial (%) |
| $SiF_3^+$ | 96.9 | 93.6 |
| $Si_2OF_6^+$ | 3.04 | 4.24 |
| $SiOF_2^+$ | (—) | 1.79 |
| $CCl_3^+$ | (—) | 0.159 |
| $SiO_2F_2^+$ | 0.076 | 0.098 |
| $Si_2O_2F_4^+$ | (—) | 0.081 |

TABLE I-continued

| | Mass spectrometric analysis of SiF$_4$ | |
|---|---|---|
| Ion | SiF$_4$ prepared from H$_2$SiF$_6$ (%) | SiF$_4$ commercial (%) |
| SiO$_2^-$ | (−) | 0.035 |

The final clear solution was then analyzed by plasma emission spectroscopy (PES). The results are listed in Table II, together with PES analysis of the waste by product H$_2$SiF$_6$ and the NaF used to precipitate Na$_2$SiF$_6$ (18 and 22 FIG. 1). Comparison of the first two columns of Table II with column three shows that the concentration of some elements, e.g., Li, B, V, Mn, Co, K, and Cu, were unchanged by precipitation of Na$_2$SiF$_6$ whereas the elements Mg, Ca, Al, P, As, and Mo were diminished by a factor of 5-10. Some elements were concentrated into the Na$_2$SiF$_6$, namely Cr, Fe, and Ni. The fourth column in Table II is representative of the impurity content to be found in SiF$_4$ gas prepared on a commercial scale.

The low content of P is of special significance for both semiconductor and solar cell applications. Elements known to reduce solar cell efficiency (V, Cr, Fe, Mo) are uniformly low in commercial grade SiF$_4$. Only Mn, As, and Al are of comparable concentration in both Na$_2$SiF$_6$ and SiF$_4$ at the 1 parts per million (ppm) by weight or less level.

SiF$_4$/Na reaction, the central operation of the pure Si process, (FIG. 1) is the reduction of SiF$_4$ by Na according to the reaction

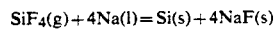

$$SiF_4(g) + 4Na(l) = Si(s) + 4NaF(s)$$

This reaction is thermodynamically favored at room temperature, however, it has been found experimentally that Na has to be heated to about 150° C. before any appreciable reaction can be observed. Once the reaction has been initiated the released heat raises the temperature of the reactant (Na) which in turn increases the reaction rate. Under adiabatic conditions, a temperature of about 2200K is predicted for the reaction with the stoichiometric quantities of SiF$_4$ and Na. In practical reactors, rapid consumption of gaseous SiF$_4$ produces a pressure decrease.

TABLE II

| | Plasma emission spectroscopy analysis, ppm (wt) | | | |
|---|---|---|---|---|
| Element | H$_2$SiF$_6$ | NaF | Na$_2$SiF$_6$ | SiF$_4$ |
| Li | 0.1 | (−) | 0.2 | 0.01 |
| Na | 460 | (−) | (−) | 1.8 |
| K | 9.0 | (−) | 8.0 | 0.3 |
| Mg | 55 | (−) | 6.4 | 2.3 |
| Ca | 110 | 10 | 18 | 1.6 |
| B | 1.0 | (−) | 0.8 | <0.01 |
| Al | 8.0 | <2.5 | 1.3 | 1.2 |
| P | 33 | (−) | 5 | 0.08 |
| As | 8.8 | (−) | 0.2 | 0.28 |
| V | 0.3 | <5 | 0.3 | <0.01 |
| Cr | 0.8 | <3.5 | 8.8 | <0.01 |
| Mn | 0.2 | <4 | 0.4 | 0.16 |
| Fe | 13 | <7 | 38 | 0.04 |
| Co | 0.54 | (−) | 0.7 | <0.01 |
| Ni | 1.17 | <8 | 4.2 | <0.01 |
| Cu | 0.12 | <4 | 0.6 | <0.01 |
| Zn | 1.4 | (−) | 1 | <0.01 |
| Pb | 14.5 | (−) | 5 | 0.03 |
| Mo | 11 | (−) | 1.0 | <0.01 |

The kinetic behavior of the Na-SiF$_4$ reaction is complex because of the interplay of several factors, e.g., pressure of SiF$_4$, vaporization of Na, local temperature, porosity of two solid products, and transport of SiF$_4$ and Na vapor through the product crust that forms on the liquid Na.

Although only preliminary studies have been made of the kinetics, the general features of this reaction have been surveyed. In a series of experiments to estimate reaction temperature 5 grams of Na were loaded in a Ni crucible (3 cm ID, 4 cm high) and heated in SiF$_4$ initially at about 1 atm pressure. The Na surface tarnished at about 130° C., with the formation of a thin brown film. As the temperature increased, the color of the surface film gradually changed from light brown to brown and finally to almost black. The SiF$_4$/Na reaction became rapid at about 160°±10° C. and liberated a large amount of heat, as indicated by a sudden rise in reaction temperature. The pressure in the reactor typically decreased slightly until the temperature increased sharply, with an associated rapid decrease in SiF$_4$ pressure. The reaction lasts for several seconds only (until the Na is consumed). For SiF$_4$ pressures below about 0.3 atm the reaction mass was observed to glow at a dull red heat. For higher pressure, a characteristic flame was observed. The shortest reaction time (20 sec) and the highest temperatures (about 1400° C.) were obtained when the initial pressure of SiF$_4$ was about 1 atm. In addition, complete consumption of Na was obtained for 1 atm SiF$_4$. When scale-up of this reaction was attempted by loading larger amounts of Na, it was found that as the depth of the Na pool increased, the amount of Na remaining unreacted also increased. The product formed a crust on top of the Na surface, building a diffusion barrier for the reactants. As the barrier thickness increased, the reaction slowed and eventually stopped.

For separation (operation 14 FIG. 1) of the silicon from the products of reduction, in the preferred melt separation process embodiment of this invention, the products are heated until a melt is formed and the NaF is diverted (36 into mold 200) leaving the Si 34 which is then cast into mold 200 pre-filled with NaF. The melting, separation and casting process is described in detail below in connection with the scaled up system. Leach separation is described in the copending Sanjurjo application previously referenced. In the leach process, the silicon and sodium are removed and combined with water and a selected acid. The resultant silicon and water soluble sodium fluoride are then separated.

On the basis of studies of the parameters that affect the reaction, a system is developed that is shown with various reactant feed arrangements and reaction product separation configurations in the central vertical sections through the reactors of FIG. 3. It is noted that all of the reactant feed arrangements are specifically designed to cause the reduction reaction to take place far enough away from the feed system (into the reactor) positively to prevent build up of reaction products at the entry and, thus, avoid any possibility of plugging of the entering reactants.

The upper section 40 of the reactor system, shown somewhat schematically in FIG. 3, constitutes a reactant (Na and SiF$_4$) dispenser and the lower section 42 is the reactor section where the reaction takes place. In this illustrated embodiment, the reactant dispenser section 40 includes a stainless steel liquid sodium injection tube 44 vertically and centrally located in the top flange 46 of the reactor. The Na injection tube 44 is provided with a conventional stainless steel belows valve 48 for controlling Na flow into the reactor section 42. The inner diameter of the Na injection tube 44 is selected to provide the desired Na jetting action, assure an appropriate Na stream ejection velocity and Na stream size.

In order to bring the reactants together in the reaction zone and to provide some cooling of the entering liquid Na, a $SiF_4$ feed head 50 is positioned concentrically around the entry portion of the Na ejection tube 44 with its ejection aperture 52 positioned to feed $SiF_4$ into the reactor concentrically around the Na stream 54. The $SiF_4$ is fed into the reactor at room temperature and its entry is controlled by a constant pressure valve 56 in order to keep pressure constant in the reactor at from about 0.5 to about 5 atmospheres. That is, as $SiF_4$ is fed concentrically with the Na into the hot zone of the reactor, the $SiF_4$—Na reaction takes place depleting $SiF_4$. The depletion in turn activates the constant pressure valve 56, thus, feeding more $SiF_4$ into the reactor. The resultant gas flow keeps a relatively constant temperature at the injection region by its cooling action and by producing a jet that keeps hot particles of reaction products from reaching the nozzle end of Na feed tube 44. Keeping the reaction products away from the reactant entry area in this manner eliminates plugging of the injection apertures.

This mode of operation increases the rate of Si production. Using a Na nozzle exit aperture of 0.005 inch and jetting Na above its reacting temperature of about 150° C., the reaction takes place far enough away from the entry area to prevent plugging for injection temperatures up to about 250° C. No plugging occurs for reaction temperatures up to about 900° C.

The reduction reaction (FIG. 1 operation 12) takes place in the lower reactor section 42 of the reactor system. As previously noted, the reduction reaction is highly exothermic and therefore, temperature control is desirable to help prevent reaction products from moving up near the reactant injection area. Such control prevents reactants from plugging the injection nozzle and preventing reactant injection. With temperature control in mind, the top reactant injection nozzle supporting flange 46 for the reactor 42 is cupped 58 or recessed (upwardly in the drawing) thermally to isolate the injection area from the hotter regions of the reactor 42. Further isolation from the hot reaction region is provided by inserting a disk like toroidal heat insulating baffle 60 between the reaction zone and the nozzle thus, effectively forming a semi-isolated nozzle entry chamber 62. The centrally located aperture 64 in the baffle 60 is of a size to let reactants from the nozzle enter the reaction zone, prevent the injected products from spraying the outer reactor walls and minimize heat transmission between the reaction area in the reactor 42 and the nozzle entry chamber 62.

Additional temperature control is provided by water cooled tubing 66 which extends around the cupped portion 58 of the nozzle supporting flange 46. In this connection, note again that it has been found experimentally that Na reacts with $SiF_4$ only above about 150° C. Therefore, as long as the cooling coils 66 in cooperation with the reactant input temperatures, jet velocities and heat shielding baffle 60 maintain the reactant feed area below this temperature, premature reaction at the feed port and nozzle plugging is prevented. Further to the point of preventing premature reaction, the $SiF_4$ is preferably injected at a temperature of between about −86° and 120° C. and the liquid Na is jetted at a temperature of between about 98° and 130° C.

It is contemplated that the reaction products (NaF and Si) will be separated by a melt process at temperatures above the melting point of Si (1412° C.) and preferably in the range between about 1450° and 1500° C. It is also contemplated that the separation and removal of the reaction products will take place on a continuous basis. The physical structure and configuration of the reactor portion 42 of the system is designed to produce such results.

As illustrated, the reactor section 42 includes a double container arrangement with an outer generally cylindrical container 70, designed to capture and dispense the liquid NaF reaction product, surrounding an inner cylindrical reaction product receiving and separating container 72. In order to withstand the high temperatures involved and to avoid contaminating the reaction products, the inner container 72 is composed of high purity graphite and in order to perform the separation of reaction products, the container walls are made with small continuous perforations. For simplicity, the perforations are not shown in the drawing. The bottom 74 of the container 72 is generally conical in shape with a solid non-porous cylindrical molten Si removing drain pipe 76 in the center and thus, has the appearance of a common funnel. The drain pipe 76 is shown closed by a movable drain plug 78. The condition illustrated is for a normal run in process with reaction products built up and some melt separation products in place.

The Na and $SiF_4$ are jetted into the inner container 72 through the aperture 64 in the heat insulating baffle 60 and reaction starts to take place in the hot upper reaction zone 80. As the reaction proceeds, a pool 82 of reacted and partially reacted Na and $SiF_4$ form where the reaction goes to completion (pool described above). Immediately below the pool of reaction products 82, a hotter melt separation zone 84 is formed. The melt separation zone 84 is maintained at a much higher temperature (means of heating explained below) than the reaction products zone 82 above it and the reaction products effectively melt out. At these temperatures, i.e., temperatures above about 1412 degrees C., the reaction products (Si and NaF) are liquids which are separable because the NaF will normally float on top of the Si. That is, the liquid Si, which is more dense than NaF, agglomerates and settles to the bottom of the reactor vessel 72. Liquid NaF, which melts at about 993° C., is immiscible with Si and usually wets graphite in the presence of liquid Si. The more or less spherical globules 86 of Si dispersed in the NaF 88 and the large Si ingot or pool 90 at the bottom, as illustrated in FIG. 3, look much like those actually found in a sectioned graphite container after the reaction products, heated to the temperatures contemplated here, have been allowed to cool (solidify). It is apparent that, while molten, the NaF both coats the Si and wets the graphite, thus, providing a barrier which prevents the Si from reacting with the graphite and avoids any impurity transfer or migration through and from reactor walls.

Due to its relatively high surface tension (relative to NaF), Si remains in a porous or perforated container while the low surface tension NaF flows out the pores or perforations provided the pores are of the proper size for the temperatures of the reaction products. It has been determined experimentally that for the melt zone temperatures contemplated, perforations in the walls of the inner reaction product receiving and separating container 72 of between 2 and 3.5 millimeters (mm), the NaF flows through the perforations (not shown) while the molten Si remains in the container 72. The average dimension of the perforations 79 may be from less than 0.5 mm to about 3 mm or greater, preferably between about 0.2 mm to about 3.5 mm, more preferably between about 1 mm to about 3.5 mm, and most preferably between about 2 mm to about 3.5 mm. If the perforations are appreciably smaller than 2 mm, the NaF does not discharge well unless pressure is applied and for apertures appreciably greater than 3.5 mm Si has a tendency to enter and interfere with NaF discharge. The Si is removed by extracting the movable closure plug 78 to allow the Si to flow out of the reaction container drain pipe 76. The flow is adjusted so that the process is continuous. That is, the flow of Si out the pipe 76 is adjusted so that the reduction reaction is continuously taking place in the reaction zone 80 and reaction products continuously settle through the reaction product zone 82 and into the melt separation zone 84 with NaF continuously flowing out the perforated inner reaction container 72 and Si agglomerating at the bottom and being continuously withdrawn from the drain pipe 76.

The generally cylindrical outer container 70 of the reactor section 42 performs the functions of collecting and dispensing the NaF (separated reaction product), physically supporting the inner graphite reaction product receiving and separating container 72 and supporting both induction heating elements which heat the inner container 72 and the insulation which minimizes radiation heat loss. The functions performed by the outer container 70 in large measure prescribe the characteristics of the material and its structure. For example, the fact that the container 70 collects and dispenses the NaF reaction product which seeps through the perforations in the inner reaction chamber 72 makes it desirable to make the container of a material which will not slough off, react with the hot NaF, or in any way introduce contaminates which would prevent the NaF from being recycled without being purified. It is also desirable that the outer container 70 be spaced far enough from the inner container 72 to provide free flow for the NaF. The walls of the two containers 70 and 72 are held in their spaced relationship at the top by means of an annular graphite ring 96 which snuggly surrounds the inner container 72 near its top and fits tightly inside the outer container 70 and at the bottom by means of the reaction container drain pipe 76 which is sealed in the exit aperture 98 in the bottom 100 of the outer container 70. The NaF is discharged through a drain pipe 104 at the bottom (right side in drawing) of the outer container 70.

The outer container 70 must also have sufficient physical strength to perform its support functions and be nonconductive to allow the internal reaction chamber 72 to be inductively heated by water cooled heating coils 92 which surround the lower melt separation zone 84. Silicon carbide (SiC) is a material which meets the criteria for the container 70. However, it must be made in such a way that it has a high enough resistivity to allow the induction heating coils 92 to heat the internal reaction chamber. If SiC is used, it should be lined with graphite, Si or another noncontaminating powder as taught in the copending Sanjurjo patent application P-1602 (Ser. No. 337,136), supra., to assure that no contaminants are added to the reaction products from the container walls. Beryllia (BeO) is also a high strength ceramic which meets all of the above criteria for the outer container 70.

For heating efficiency and to reduce heat radiation from the reactor, the heating coils 92 are covered with a silica felt insulation 94 (1.3 cm thick). The top flange 46 of the reactor 42, the flange which supports the reactant injection nozzles (Na injection tube 44 and $SiF_4$ feed head 50), mates and is sealed to an outwardly extending lip or flange 102 around the top of the outer reaction chamber or vessel 102.

The Si discharged via the exit pipe 76 is directed into mold 200, as illustrated, it is continuously cast into articles in accordance with the practice of the present invention. In order to form the Si articles, the Si exit pipe 76 (below the blocking plug 78) discharges the molten Si through a graphite discharging Section 108 where the central aperture necks down to form a Si discharge channel 110 that is circular in cross section. Since the Si in the inner reaction product receiving and separating container 72 is in the presence of NaF salt and the salt wets the Si but not the graphite (as explained above) formation of SiC is prevented. As the Si is discharged through the circular channel 110 and section 108 the salt (NaF) coats and isolates (coating designated 112) it from the container wall throughout its length.

In order to assure liquification of the Si 106, uniform temperature is imposed along the length of the channeling section 108. For this purpose, electrical heating coils 114 are provided around the channeling section 108 and in order to provide heat, the silica felt insulation 94 also extends down around both the coils 114 and channeling section 108. The temperature is maintained such that the Si 106 remains at above about 1412° C. as it travels down the channel and the salt (NaF) coating 114 also remains molten. In accordance with the practice of the present invention, the temperature may gradually decrease along the length of the channeling section 108 from above about the melting point of Si to the melting point of Si.

In accordance with the practice of the present invention, the use of molten NaF to pre-fill one or more mold cavities is particularly advantageous for casting wafer shaped articles. The molten NaF 217 within mold 200 (FIGS. 6 and 7) serves to prevent direct contact of carbon or graphite with air and also serves as a barrier between silicon 216 and carbon so as to prevent the formation of silicon carbide. Molten NaF discharged through drain pipe 104 is injected into a heated mold 200 (filling the mold 200 with molten NaF 217 as illustrated in FIG. 6 and 7) via a NaF injector (not shown). The molds suitable for use in the present invention are constructed of inexpensive high purity graphite plate segments. The segments (various modular shapes) can be assembled to form any desired number of cavities or a single cavity capable of receiving molten NaF and silicon. The novel modular segments (201, 202, 203, 204, and 205) comprising the molds of the present invention are designed so that when assembled, they form one or more cavities which are interconnected by a separator plate flow passage 207 and 208 to permit entry of NaF 217 and displacement of the salt by molten silicon 216.

Modular segments forming the molds of the present invention may be prepared from graphite sheet (Grafoil) by punching or cutting or formed from solid graphite into desired shapes. In a simple arrangement, a four cavity modular mold assembly (shown in FIG. 4) is constructed by stacking a cavity plate segment 204 on top of a bottom plate segment 205 followed (alternately) by a separator plate segment 203, a cavity plate segment 202, a separator plate segment 201, a cavity plate segment 202, a separator plate segment 203, a cavity plate segment 202, and a (cover) separator plate segment 201. Segment 201 is provided with at least one alignment notch 210 on its outer periphery, an interconnecting cavity neck passage 207 adjacent the notch 210 in spaced apart relationship, and a sprue port forming passage 206. Segment 202 is provided with at least one alignment notch 210 on its periphery, a central cavity defining passage 209, and a sprue port forming passage 206. Segment 203 is provided with at least one alignment notch 210 on its periphery, and an interconnecting neck passage 208 which is adjacent to a sprue port forming passage 206. Segment 204 is provided with at least one alignment notch 210 on its periphery and a central cavity defining passage 209 which is in communication with a sprue port forming passage 206. Segment 205 is provided with at least one alignment notch 210 on its periphery. Preferably, the sprue port dimension (effective cross section) may range from about less than 10 mm to about 30 mm or greater.

In a more complex arrangement, an eight-cavity modular mold assembly (see FIGS. 5, 6, and 7) is constructed following the same stacking order as described for the four-cavity modular mold 200 (FIG. 4).

In the practice of the instant invention, any desired number of cavities can be constructed in this manner. Any desired stacking sequence may be chosen to form wafer-shaped articles of any desired thickness by stacking two or more cavity plate segments 202 in series. The thickness of the cavity segments forming the molds of the invention may range from less than about 3 mm to about 8 mm or greater, more preferably from about 1 mm to about 5 mm. Two or more cavity plate segments 202 formed from thin Grafoil and/or thick graphite blocks may be combined and stacked in any desired order to give any desired cavity thickness. Moreover, the cavity plate segments 202 may be configured to any desired shape, for example, circular (as illustrated in FIG. 4), square, hexagonal and the like. The planar cavity dimensions (effective cross section) of the cavities forming the molds may range from less than about 3 cm to about 300 cm or greater, more preferably from about 75 cm to about 200 cm.

The assembled modular molds of the instant invention are maintained in their stacked configuration, preferably nested in a closed fitting mold container (not shown) such as a large graphite crucible. A suitable weight (not shown) is utilized to provide compression so as to keep the individual plate segments (as shown in FIGS. 5, 6 and 7) tightly pressed together.

A carbon rod (not shown) may be used to aid alignment (abutting notch 210) of the various (assembled) plate segments. Other ways of alignment may be used, such as having a part of the outer (modular segment) periphery shaped to serve as an alignment edge.

After the plate segments are suitably arranged, as illustrated in FIGS. 5, 6, and 7, the cavities defined by the stacking plate segments are filled with NaF 217 through a sprue port (defined by the stacking arrangement of the sprue port forming passages 206). The filling direction (flow of NaF 217) is downward toward the (bottom) cavity plate segment 204 (central cavity 209, sprue port forming passage 206, and common connecting passage 212 therebetween). As the NaF 217 fills the (bottom) cavity, it ascends upward filling one cavity after another through the interconnecting ports 207 and 208, displacing any gases residing within the cavities of mold 200.

When mold 200 is completely filled with NaF 217, molten silicon 106 is then injected through a silicon injector 214 into the sprue port (defined above). Since the density of silicon is greater than NaF, the path of filling the mold 200 by the molten silicon 106 will follow essentially the same path described for NaF 217, except NaF 217 will be displaced by the heavier silicon 106. As silicon 216 rises and fills each cavity, the overflow will enter the next highest cavity. The molten NaF 217 is displaced upward but always serves as a barrier between mold 200 (carbon) and silicon 216 to prevent SiC formation. The displaced NaF 217 will exit from mold 200 through the top port 207 and through the top of the sprue port 206. The displaced NaF 217 may be contained in a suitable region outside of the mold cavity (in the upper section of the mold container) and recycled in the molding process.

The mold 200 filled with silicon 216 may be slowly cooled to permit large silicon grains to grow in each cavity, preferably by directional cooling from the bottom up. The stack of plate segments may be dumped out of the mold container by inverting the container while the temperature is above the melting point of NaF.

Alternatively, the entire assembly of plate segments forming mold 200 including the mold container may be cooled and subsequently removed by a conventional aqueous leaching process. For example, the salt coating 217 is readily removed in 1.0N acid solution. For a discussion of aqueous leaching of Si, see copending Sanjurjo patent application Ser. No. 337,136 entitled Process and Apparatus for Obtaining Silicon from Fluosilicic Acid filed Jan. 5, 1982 and assigned to the assignee of the present invention. The multiple wafer casting system has the added advantage that the molten coating salt (NaF 217) acts as a purifying agent. This effect adds to the versatility of the casting technique. That is, the fact that the additional purification is obtained allows the casting technique to be used with relatively inexpensive feed grades of Si that would not normally be considered for a solar grade end product. Where the casting process is used apart from the melt separation process which, as illustrated, already uses the NaF salt, other salts which wet Si but not the container walls may be used. It has been found that either $Na_2SiO_3$ or NaF or a combination of the two perform both the wetting and the purification functions.

The resulting silicon 216 wafer shaped articles after separation from mold 200 may be cut at the necks (formed at passages 207 and 208) with a diamond saw so as to leave wafers with substantially smooth surfaces.

Some of the graphite plate segments used for forming mold 200 may be recovered after the wafers are separated from the body of mold 200 and reused for economy.

The process sequence shown in FIG. 1 was selected because of the inherent simplicity of the steps and their independent and combined suitability for scale-up. Some purification occurs during precipitation (operation 1, FIG. 1) for Mg, Ca, Al, P, and As due to the high solubility of their fluosilicates and fluosalts. Some concentration takes place for Cr, Fe, and Ni, and this effect may be due to coprecipitation of these elements as fluorides since their fluosilicates are very soluble. From Table II, it is clear that most of the purification is accomplished as a result of the thermal decomposition in step 24 (FIG. 1). Most transition metal fluorides are in very stable condensed phases at the decomposition temperature (650° C.) in step 24 (FIG. 1) and, therefore, will stay in the solid. In addition, volatile fluorides formed during the decomposition of fluosalts such as $Na_2TiF_6$ and $Na_2ZrF_6$ will condense upon cooling of the $SiF_4$ gas stream from step 24. The condensed material is then removed from the gas mainstream by in-line fume particle filtration. The presence of any metallic or dopant impurities was not detected using mass spectrometry (Table I) in either the gas produced in the above reaction or in the commercial $SiF_4$ gas. The analysis done on the $SiF_4$ by passing the gas through high purity water was based on the hypothesis that impurities should be hydrolyzed and/or trapped in the $SiO_2$ formed.

The results listed in Table II show that the level of metal impurities in the resulting $SiO_2$ is so low that, for practical purposes, the $SiF_4$ can be considered free of metallic impurities. The Na feed, reactor materials, and possible contamination of the product during handling remain as possible sources of impurities in the Si.

The impurities in Na can be divided roughly into three types according to their tendency to react with $SiF_4$, as classified by the free energy of reaction. The first type of impurity includes aluminum and elements from the groups Ia, IIa and IIIB. The free energy of reaction of $SiF_4$ with these impurities ranges from about $-100$ to $-200$ kcal/mole $SiF_4$ at room temperature and from $-50$ to $-100$ kcal/mole $SiF_4$ at about 1500 K. It is expected, therefore, that even when these impurities are present at the ppm level, they will react with the $SiF_4$ to form corresponding fluorides. Subsequently, the fluorides will be dissolved preferentially in the NaF phase.

The second type impurity includes transition metals such as Mo, W, Fe, Co, Ni, and Cu, and the elements P, As, and Sb. These elements exhibit positive free energies of reaction in excess of about 100 kcal/mole $SiF_4$ and are not expected to react with $SiF_4$. However, it is an experimental fact that the silicon resulting from the $SiF_4$—Na reaction contains amounts of Fe, Ni, and Cr in proportion to the concentration of these elements in the Na feed. The mechanism by which these metals are transferred to the silicon has not yet been studied. In any case, the concentration of Fe, Cr, Ni, and also Ti can be decreased by a factor of about $10^4$ to $10^6$ for single-pass directional solidification or the Czochralski crystal-pulling procedures used presently for solar cell manufacture. At the resulting levels, these elements would not be detrimental to solar cell performance.

Boron represents a third type of impurity. The free energy of reaction of this element with $SiF_4$ is positive but small (5–20 kcal/mole $SiF_4$ for temperatures up to about 1500 K.); therefore, some partial reaction can be expected and B will be distributed between the NaF and Si phases. It is noted that the levels of the dopant elements B, P, and As in the reaction Si are the same as in the semiconductor grade silicon used as reference or control. Since it is convenient to have dopant levels as low as possible to permit flexibility in subsequent doping procedures for semiconductor and solar cell applications, the low B and P content of Si produced in this process is of advantage. It is noted that the purity of the silicon produced by the $SiF_4$—Na reaction is, at a minimum, nominally appropriate for solar cell manufacture.

From the foregoing discussion, it will be understood that the objects of the invention have been carried in that high purity Si can be prepared and cast using the inexpensive starting materials $H_2SiF_6$ and Na. Favorable thermodynamics of the reduction step, easily controlled kinetics, and abundant availability of inexpensive starting materials make this method attractive. Of special interest for semiconductor applications are the low concentrations of B and P impurities in the product Si. The Si produced by the $SiF_4$—Na reaction, particularly when purified further by directional solidification (the casting), should be a low cost material suitable for the manufacture of solar cells and other semiconductor products.

While particular embodiments of the invention have been shown, it will, of course be understood that the invention is not limited thereto since many modifications in both process and apparatus employed may be made. It is contemplated that appended claims will cover any such modifications as fall within the true spirit and scope of the invention.

What is claimed is:

1. A non-pressing, non-squeezing, non-flattening, and non-Si spherical pool forming method for casting silicon articles of preselected shape suitable for fabricating into solar cells by reaction of gaseous silicon tetrafluoride with sodium in substantially stoichiometric quantities to produce a reaction product from which molten silicon and molten NaF are recovered and wherein said silicon tetrafluoride gas used in the reaction is obtained by thermal decomposition of sodium fluosilicate which is precipitated from aqueous fluosilicic acid generated from phosphate rock conversion to fertilizer, said process comprising:

a) assembling a plurality of modular segments into a mold having a preselected number of interconnected cavities capable of receiving molten NaF and molten silicon, said mold including at least one of a first separator plate segment, at least one of a first cavity plate segment, at least one of a second separator plate segment, at least one of a second cavity plate segment, and a bottom plate segment, said mold being formed by assembling said modular segments in a selected stacking order of said first separator plate segment, said first cavity plate segment, and said second separator plate segment one upon another so as to form a series of connected mold cavities separated alternately by said first separator plate segment and said second separator plate segment, said second separator plate segment below a last said first cavity plate segment being followed by said second cavity plate segment and said bottom plate segment with the proviso that if the first segment of said mold is a second separator plate segment, then the last separator stacked below the last said first cavity plate segment forming said mold is a first separator plate segment; each of said modular segments forming said mold having a substantially identical outer periphery, said outer periphery having an alignment notch thereon and said modular segments with said alignment notch when assembled in said selected stacking order define a continuous notch having a length coextensive with the height of said modular segments forming said mold, said first separator having at least one of a cavity neck passage and at least one of a sprue port forming passage therethrough and oppositely disposed, each proximate said outer periphery in spaced apart relation, said first cavity plate segment having at least one of a central cavity and at least one of a sprue port forming passage therethrough and oppositely disposed, proximate on opposite sides of said outer periphery in side-by-side spaced apart relation, said second separator plate segment having at least one of a cavity neck passage and at least one of a sprue port forming passage therethrough disposed in side-by-side spaced apart abutting relation, both positioned substantially proximate on one side of said outer periphery, said second cavity plate segment having at least one of a central cavity and at least one of a sprue port forming passage therethrough and oppositely disposed in side-by-side relation connected by a common connecting passage, and said bottom plate segment having a non-interrupted planar surface; said modular segments with said sprue port forming passage when assembled in said selected stacking order define a sprue port within said mold and having a continuous depth essentially coextensive with the height of said mold capable of receiving said molten NaF and said molten silicon into said central cavity formed by at least one said second cavity plate segment lying coplanar between selected said modular segments of said mold; one or more of said first cavity plate segments with said central cavity when assembled in said selected stacking order define one or more said central cavities within said mold capable of containing said molten silicon and NaF; said first separator plate segment and said second separator plate segment with respective said cavity neck passages when assembled in said selected stacking order are capable of providing liquid flow of said molten silicon and NaF between one or more said central cavities formed by said selected stacking order of said first cavity plate segment and said second cavity segment;

b) maintaining said mold in stacked configuration;

c) heating said mold to about the melting point of said molten silicon;

d) injecting said molten NaF downwardly into said sprue port through said sprue port forming passage of said mold, filling said bottom cavity first with said molten NaF and further filling one cavity after another above said bottom cavity in an ascending order through said interconnecting ports thereby displacing gases residing within said mold and completely filling said mold with said NaF;

e) injecting said molten silicon downwardly into said sprue port through said sprue port forming passage of said mold filled with NaF, filling said bottom cavity first with said molten silicon and continuing filling one cavity after another above said bottom cavity in an ascending order through said interconnecting ports thereby substantially displacing said molten NaF residing within said molten and substantially filling said mold with said molten silicon;

f) cooling said mold containing essentially said molten silicon at a selected temperature rate to below about the solidification temperature of said silicon; and g) removing said silicon after solidification by disassembling said mold.

2. A method according to claim 1 wherein said mold is formed of graphite.

* * * * *